(12) United States Patent
Brunco

(10) Patent No.: US 9,929,159 B2
(45) Date of Patent: Mar. 27, 2018

(54) METHOD, APPARATUS, AND SYSTEM HAVING SUPER STEEP RETROGRADE WELL WITH SILICON AND SILICON GERMANIUM FINS

(71) Applicant: GLOBALFOUNDRIES INC., Grand Cayman (KY)

(72) Inventor: David Paul Brunco, Latham, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/053,984

(22) Filed: Feb. 25, 2016

(65) Prior Publication Data

US 2017/0250183 A1 Aug. 31, 2017

(51) Int. Cl.
| | |
|---|---|
| H01L 27/092 | (2006.01) |
| H01L 21/8238 | (2006.01) |
| H01L 21/02 | (2006.01) |
| H01L 21/306 | (2006.01) |
| H01L 21/265 | (2006.01) |
| H01L 29/167 | (2006.01) |
| H01L 29/10 | (2006.01) |
| H01L 21/762 | (2006.01) |
| H01L 29/06 | (2006.01) |

(52) U.S. Cl.
CPC .... *H01L 27/0924* (2013.01); *H01L 21/02532* (2013.01); *H01L 21/26513* (2013.01); *H01L 21/30604* (2013.01); *H01L 21/76224* (2013.01); *H01L 21/823821* (2013.01); *H01L 21/823878* (2013.01); *H01L 29/0649* (2013.01); *H01L 29/1037* (2013.01); *H01L 29/1095* (2013.01); *H01L 29/167* (2013.01)

(58) Field of Classification Search
None
See application file for complete search history.

(56) References Cited

U.S. PATENT DOCUMENTS

| | | | | |
|---|---|---|---|---|
| 2014/0252479 | A1* | 9/2014 | Utomo | H01L 29/785 257/347 |
| 2014/0353767 | A1* | 12/2014 | Liu | H01L 21/845 257/401 |

* cited by examiner

*Primary Examiner* — Reema Patel
*Assistant Examiner* — Steven Christopher
(74) *Attorney, Agent, or Firm* — Williams Morgan, P.C.

(57) ABSTRACT

At least one method, apparatus and system disclosed involves forming a finFET device having silicon and silicon germanium fins. The method includes: forming an n-doped and a p-doped region in a semiconductor wafer; forming a layer of silicon above both the those regions; removing a portion of the silicon layer above the p-doped region to create a first recess; forming a layer of silicon germanium in the first recess; etching away at least a portion of the silicon layer and the underlying p-doped region; etching away at least a portion of the silicon germanium layer and the underlying n-doped region; forming fins from the unetched silicon and silicon germanium layers; and forming a shallow trench isolation dielectric in the etched away portion of the silicon layer and the underlying p-doped region and in the etched away portion of the silicon germanium layer and the underlying n-doped region.

11 Claims, 8 Drawing Sheets

METHOD, APPARATUS, AND SYSTEM HAVING SUPER STEEP RETROGRADE WELL WITH SILICON AND SILICON GERMANIUM FINS

BACKGROUND OF THE INVENTION

Field of the Invention

Generally, the present disclosure relates to the manufacture of sophisticated semiconductor devices, and, more specifically, to various methods and structures having super steep retrograde wells with silicon and silicon germanium fins.

Description of the Related Art

The technology explosion in the manufacturing industry has resulted in many new and innovative manufacturing processes. Today's manufacturing processes, particularly semiconductor manufacturing processes, calls for a large number of significant steps. These process steps usually require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed on a group of semiconductor wafers, sometimes referred to as a lot, using semiconductor-manufacturing tools, such as an exposure tool or a stepper. As an example, an etch process may be performed on the semiconductor wafers to shape objects on the semiconductor wafer, such as polysilicon lines, each of which may function as a gate electrode for a transistor. As another example, a plurality of metal lines, e.g., aluminum or copper, may be formed that serve as conductive lines that connect one region on the semiconductor wafer to another.

In this manner, integrated circuit chips may be fabricated. In some cases, integrated circuits or chips may comprise various devices that work together based upon a hard-coded program. For example, application-specific integrated circuit (ASIC) chips may use a hard-coded program for various operations, e.g., boot up and configuration processes. The program code, in the form of binary data, is hard-coded into the integrated circuit chips.

When designing a layout of various devices with an integrated circuit (e.g., CMOS logic architecture), designers often select pre-designed functional cells comprising various features (e.g., diffusion regions, transistors, metal lines, vias, etc.) and place them strategically to provide an active area of an integrated circuit. One challenge of designing a layout is accommodating ever-increasing density of cell components and still maintain routability for connecting various components of the cells. This is increasingly a challenge as dimensions of these components get smaller, such as for 10 nm or lower integrated circuit designs.

The pre-designed functional cells are often used to design transistors, such as metal oxide field effect transistors (MOSFETs or FETs). A FET is a device that typically includes a source region, a drain region, a channel region that is positioned between the source region and the drain region, and a gate electrode positioned above the channel region. Current flowing through the FET is controlled by controlling the voltage applied to the gate electrode. If a voltage that is less than the threshold voltage of the device is applied to the gate electrode, then there is no current flowing through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this reduced spacing between the source and the drain makes it difficult to efficiently inhibit the electrical potential of the channel from being adversely affected by the electrical potential of the drain. This is sometimes referred to as a so-called short channel effect, wherein the characteristic of the FET as an active switch is degraded.

There are essentially two types of FETs: planar FETs and so-called 3D devices, such as an illustrative finFET device, which is a 3-dimensional structure. More specifically, in a finFET, a generally vertically positioned, fin-shaped active area is formed and a gate electrode encloses both of the sides and the upper surface of the fin-shaped active area to form a trigate structure so as to use a channel having a 3-dimensional structure instead of a planar structure. In some cases, an insulating cap layer, e.g., silicon nitride, is positioned at the top of the fin and the finFET device only has a dual-gate structure.

FinFET designs use "fins" that may be formed on the surface of a semiconductor wafer using selective-etching processes. The fins may be used to form a raised channel between the gate and the source and drain of a transistor. The gate is then deposited such that it wraps around the fin to form a trigate structure. Since the channel is extremely thin, the gate would generally have a greater control over the carriers within. However, when the transistor is switched on, the shape of the channel may limit the current flow. Therefore, multiple fins may be used in parallel to provide greater current flow for increased drive strength.

FIG. 1 illustrates a stylized depiction of a conventional finFET device. A finFET device 100 illustrated in FIG. 1 comprises a plurality of "fins" 110. The semiconductor device may be positioned in a vertical orientation, creating one or more fins 110. The source and drain of the finFET are placed horizontally along the fin. A high-k metal gate 120 wraps over the fin, covering it on three sides. The gate 120 defines the length of the finFET device. The current flow occurs along an orthogonal crystal plane in a direction parallel to the plane of the semiconductor wafer. The electrically significant height of the fin (labeled H) is typically determined by the amount of oxide recess in the fin reveal step and hence is substantially similar for all of the fins 110.

The thickness of the fin (labeled $T_{fi}$) determines the short channel behavior of the transistor device and is usually small in comparison with the height H of the fin 110. The pitch (labeled P) of the fins is determined by lithographic constraints and dictates the wafer area to implement the desired device width. A small value of the pitch P and a large value of the height H enable a desirable packing of the devices per square area resulting in a denser design, or more efficient use of silicon wafer area.

The scaling down of integrated circuits coupled with higher performance requirements for these circuits have prompted an increased interest in finFETs. FinFETs generally have the increased channel widths, which includes channel portions formed on the sidewalls and top portions of the fins. Since drive currents of the finFETs are proportional to the channel widths, finFETs generally display increased drive current capabilities.

In some cases finFET devices have been constructed with an advantageous dopant profile commonly known as Super Steep Retrograde Well (SSRW). Typically, in a finFET employing SSRW, the channel itself has no or low doping and a region immediately below the channel is moderately doped to act as a Punch Through Stop (PTS). The no or low doping in the channel benefits performance by providing improved carrier mobility from reduced alloy scattering. Also, the variability in the device performance is improved due to a reduction in random dopant fluctuations (RDF). In this type of structure, the fins are formed from silicon and they suffer from restricted mobility, particularly in pMOS regions.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a method for forming a finFET device. The method includes: forming an n-doped and a p-doped region in a semiconductor wafer; forming a layer of silicon above both the n-doped and p-doped regions; removing a portion of the silicon layer above the p-doped region to create a first recess; forming a layer of silicon germanium in the first recess; etching away at least a portion of the silicon layer and the underlying p-doped region; etching away at least a portion of the silicon germanium layer and the underlying n-doped region; forming fins of the finFET transistor from the unetched silicon and silicon germanium layers; and forming a shallow trench isolation dielectric in the etched away portion of the silicon layer and the underlying p-doped region and in the etched away portion of the silicon germanium layer and the underlying n-doped region.

Alternatively, the present disclosure is directed to a method for forming a finFET device. The method includes: forming an n-doped and a p-doped region in a semiconductor wafer; forming a layer of silicon germanium above both the n-doped and p-doped regions; removing a portion of the silicon germanium layer above the p-doped region to create a first recess; forming a layer of silicon in the first recess; etching away at least a portion of the silicon layer and the underlying p-doped region; etching away at least a portion of the silicon germanium layer and the underlying n-doped region; forming fins of the finFET transistor from the unetched silicon and silicon germanium layers; and forming a shallow trench isolation dielectric in the etched away portion of the silicon layer and the underlying p-doped region and in the etched away portion of the silicon germanium layer and the underlying n-doped region.

In another aspect of the present disclosure, a finFET device is comprised of a silicon substrate, at least two fins, and two channels. The silicon substrate has an n-doped region and a p-doped region. At least one of the fins is comprised of epitaxial silicon and has a first base adjacent the p-doped region. At least one of the fins is comprised of epitaxial silicon germanium and has a second base adjacent the n-doped region. The first channel region in the epitaxial silicon fin has an average p-dopant concentration at least a factor of about 2 lower than an average p-dopant concentration of a region located at about 0 to about 40 nm beneath the first channel region. The second channel region in the epitaxial silicon germanium fin has an average n-dopant concentration at least a factor of about 2 lower than an average n-dopant concentration of a region located at about 0 to about 50 nm beneath the second channel region.

In another aspect of the present disclosure, a system is comprised of a semiconductor device processing system and a processing controller. The semiconductor device processing system is used to manufacture a semiconductor device comprising at least one fin field effect transistor (finFET). The processing controller is operatively coupled to the semiconductor device processing system and is configured to control an operation of the semiconductor device processing system. The semiconductor device processing system is adapted to: form a p-doped region and an n-doped region in a semiconductor wafer; form a layer of silicon above both the p-doped and n-doped regions; remove a portion of the silicon layer above at least one of the n-doped regions to create a first recess; form a layer of silicon germanium in the first recess; etch away at least a portion of the silicon layer and the underlying p-doped region; etch away at least a portion of the silicon germanium layer and the underlying n-doped region; form fins of the finFET transistor device from the unetched silicon and silicon germanium layers; and form a shallow trench isolation dielectric in the etched away portion of the silicon germanium layer and the underlying n-doped region and in the etched away portion of the silicon layer and the underlying p-doped region.

BRIEF DESCRIPTION OF THE DRAWINGS

The disclosure may be understood by reference to the following description taken in conjunction with the accompanying drawings, in which like reference numerals identify like elements, and in which.

Figure 1:
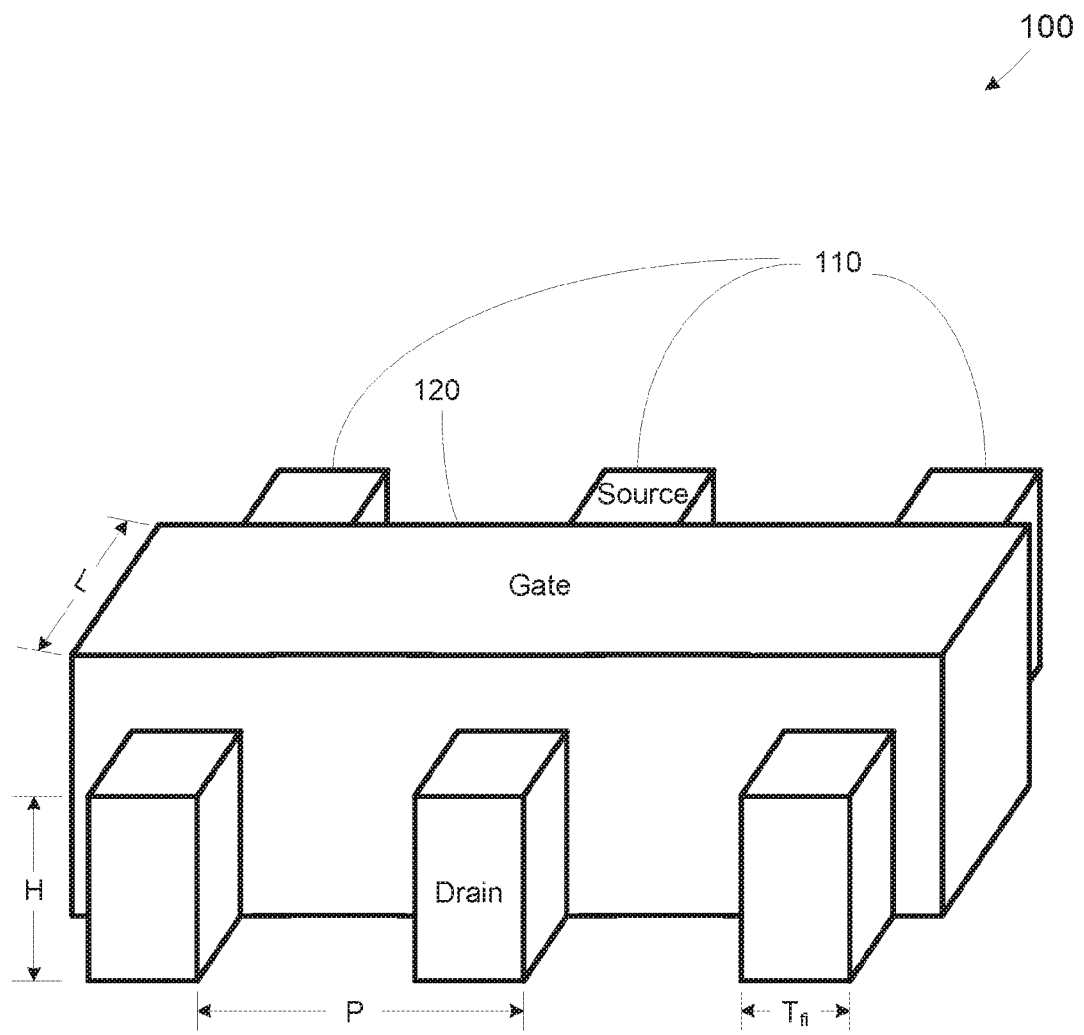
FIG. 1 illustrates a depiction of a conventional finFET device.
Figure 2:
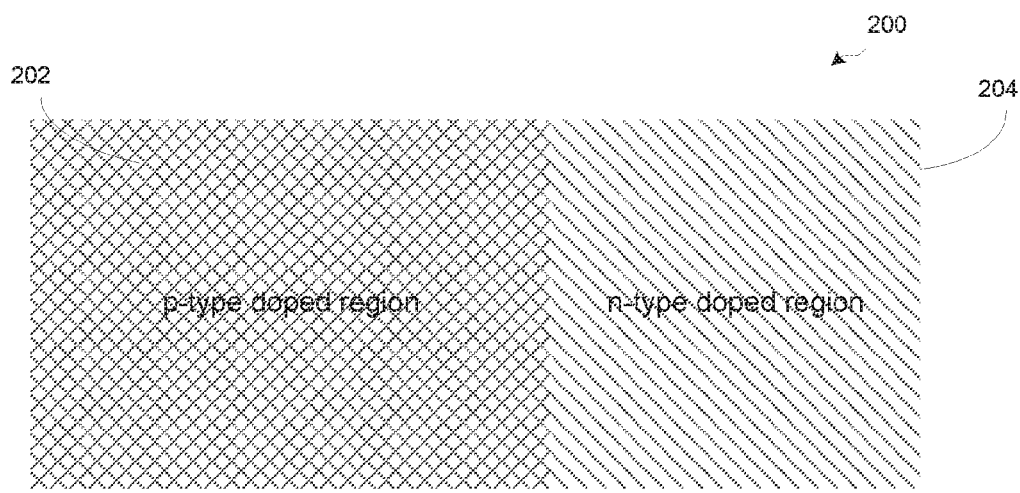
FIGS. 2-7 illustrate a stylized depiction of a series of process steps that are utilized to produce a first embodiment of a finFET device having regions that include a silicon epi layer and a silicon germanium layer.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein are directed to semiconductor devices (e.g., finFET transistors) having substantially steep retrograde wells with silicon and silicon germanium fins. The steep retrograde wells of embodiments herein may provide for forming a finFET device that advantageously has silicon (Si) fins with a lowly doped channel above a p-type doped region and silicon germanium (SiGe) fins with a lowly doped channel above an n-type doped region of the finFET.

FIGS. 2-7 illustrate one embodiment of a structure and a methodology for forming the structure that includes finFET transistors with fins that are formed from Si in an nMOS region and fins that are formed from SiGe in a pMOS region of a wafer. The process begins in FIG. 2 where a semiconductor wafer 200 is shown with a first portion 202 that is p-type doped 202 and a second portion 204 that is n-type doped 204. Those skilled in the art will appreciate that it may be useful to utilize a Zero Layer (ZL) mask to place alignment marks on the wafer 200 that may be used as a guide for litho alignment for the p-type and n-type doping processes, as well as subsequent processes described herein. Any of a variety of conventional methodologies may be utilized to form the p-type and n-type doped regions 202, 204. For example, dopants may be introduced using ion implantation, plasma doping, or surface doping following by a thermal drive-in. Ion implantation process includes implants designed primarily for Punch Through Stop (PTS), as well as deeper implants for device junction isolation. These p-type doped regions are often known as pWells and will become part of the nMOS device. Analogously, these n-type doped regions are often known as nWells and will become part of the pMOS device.

Typical species for the pWell implants include boron (B), gallium (Ga), and indium (In). Typically, B will be used for the deeper implants, and B, Ga, and/or indium (In) may be used for shallower implants. Peak dopant concentrations for these implants will typically be between about 1e18 and about 2e19 atoms/cm$^3$. In one embodiment, the average dopant concentration over about the first 50 nm of depth will typically be between about 1e18 and about 6e18 atoms/cm$^3$.

Typical species for the nWell implants include phosphorus (P), arsenic (As) and antimony (Sb). Typically, P will be used for the deeper implants, and P, As and/or Sb may be used for shallower implants. Peak dopant concentrations for these implants will typically be between about 1e18 and about 2e19 atoms/cm$^3$. In one embodiment, the average dopant concentration over about the first 50 nm of depth will typically be between about 1e18 and about 6e18 atoms/cm$^3$.

As will be shown in greater detail in subsequent aspects of the instant application, fins will be formed (see, e.g., FIGS. 6 and 7) that have a channel region at a desired location relative to the p-type doped and n-type doped regions 202, 204. Channels 704 are formed in the fins 600a, 600b in an upper portion of the fins 600a, 600b that are wrapped by the gate 702. It is desirable that the depth of the peak concentration of the PTS implants occur in a range of about 0 to about 50 nm below the channel of the fins.

An optional sacrificial screen dielectric (not shown, e.g., SiO2, SiON, SiN, etc.) may be deposited prior to the well implants. The sacrificial screen dielectric may typically have a thickness in the range of about 2 to about 10 nm thick, and may serve a variety of purposes. For example, the screen dielectric may advantageously reduce damage to the underlying Si wafer 200, it may assist in reducing channeling of implanted species, it may reduce outgassing of dopant species (e.g., As) during a subsequent annealing process, and it may provide a more abrupt final dopant profile by removing the low energy straggled implanted ions that stop in the screen dielectric. Those skilled in the art will appreciate that after the implant process and optional annealing processes are completed, the screen dielectric will typically be removed using any of a variety of conventional wet and/or dry chemistries.

Following the implantation process, it may be useful to subject the wafer 200 to an anneal process to reduce surface damage to improve a crystalline surface structure to serve as a seed for subsequent epitaxial growth. The anneal process may be a conventional thermal process performed in a batch furnace, a rapid thermal process performed in a single wafer chamber, or a laser anneal process. Thereafter, the screen dielectric, if used, may be removed, as discussed above, and then conventional epitaxial pre-cleans and a conventional epitaxial pre-bake may be performed. The pre-brake process may be in the range of about 800 to about 1000° C. for a time period in the range of about 10 s to about 300 s.

Figure 3:
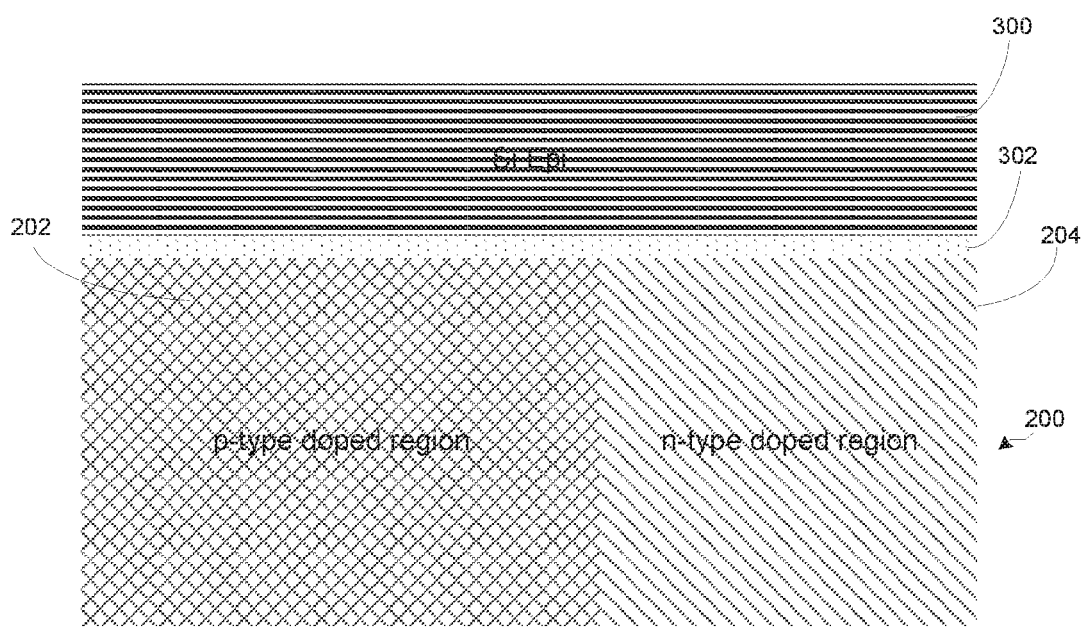

In FIG. 3, a Si epitaxial layer 300 has been grown over the wafer 200 using any of a variety of techniques. Those skilled in the art will appreciate that the thickness of the Si epi layer 300 may vary substantially without departing from the spirit of scope of the instant invention. For example, it is envisioned that the thickness of the Si epi layer may vary in the range of about 20 to about 100 nm, with a preferred range of about 30 nm to about 80 nm so that fins of a desired height may be formed therewith. The Si epi layer may be nominally undoped or very lowly doped and may be grown using either selective or nonselective epi processes. However, nonselective epi processes are typically preferred because they can be performed at a lower cost and with increased uniformity.

In an alternative embodiment, a layer 302 of silicon carbon (SiC) may be deposited intermediate the wafer 200 and the Si epi layer 300. The layer 302 may be optionally used to serve as a diffusion barrier. In particular, C is useful in suppressing diffusion of boron (B) and phosphorus (P). In one embodiment, the concentration of C may be established in the range of about 0.05 to about 1% with a thickness of about 2 nm to about 50 nm, depending upon the concentration of C. In a preferred embodiment, concentration of C is about 0.1 to about 0.4% and the layer 302 has a thickness of about 5 to about 20 nm.

Figure 4:
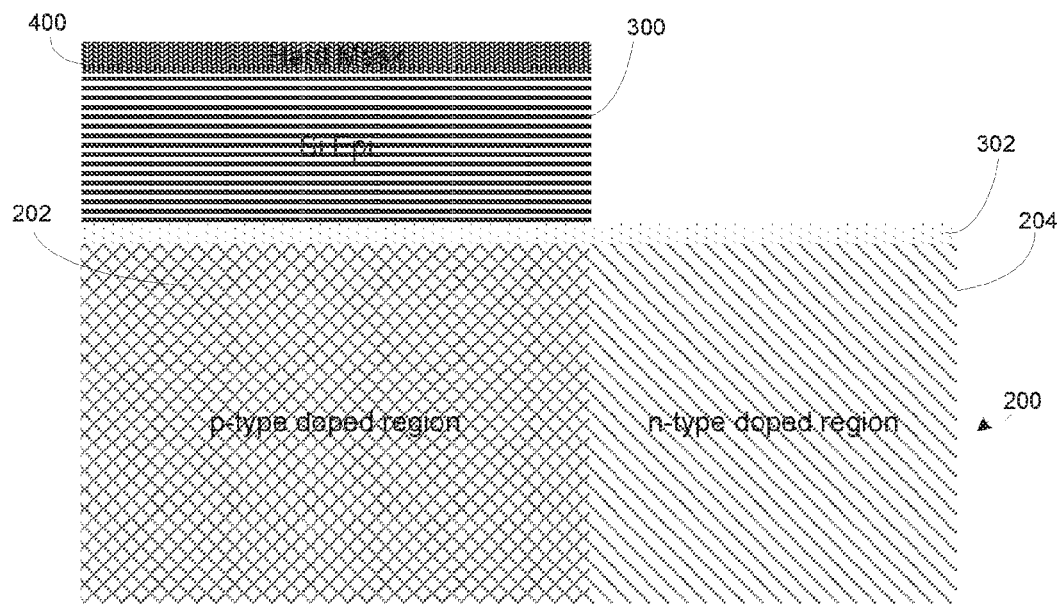

At this point in the process, any of a variety of conventional patterning and etching schemes can be used to remove portions of the Si epi layer above the n-type doped region 204. For example, a hardmask 400, which may be comprised of Si, O, N, F, C, a combination thereof, or the like, may be placed above the Si epi layer 300 in a region above the p-type doped region 202 (FIG. 4). The hard mask 400 may have a thickness in the range of about 10 to about 100 nm. A subsequent conventional etch process may be applied to the exposed region of the Si epi layer 300. Various endpoints may be utilized to identify when the etch process has reached the desired level. For example, in those embodiments that have used the optional SiC epi layer, the detection of C may be used as an endpoint indication. Alternatively, the material used for the n-type dopant may also be detected as an endpoint indication. For example, n-type dopant materials such as P, As, Sb, etc. may be detected as an endpoint indication.

At this time, it may be useful to create a Punch Through Stop (PTS) in the n-type doped region 204 that has a different depth than the PTS in the p-type doped region 202. For example, B typically diffuses more than As, and thus, As may be implanted at this point in the process (after etching the Si epi layer 300 above the n-type doped region 204). In some embodiments, the n-type doped regions 204 are first formed after the patterned etch of the silicon layer 300 rather than prior to growth of the silicon layer.

Figure 5:
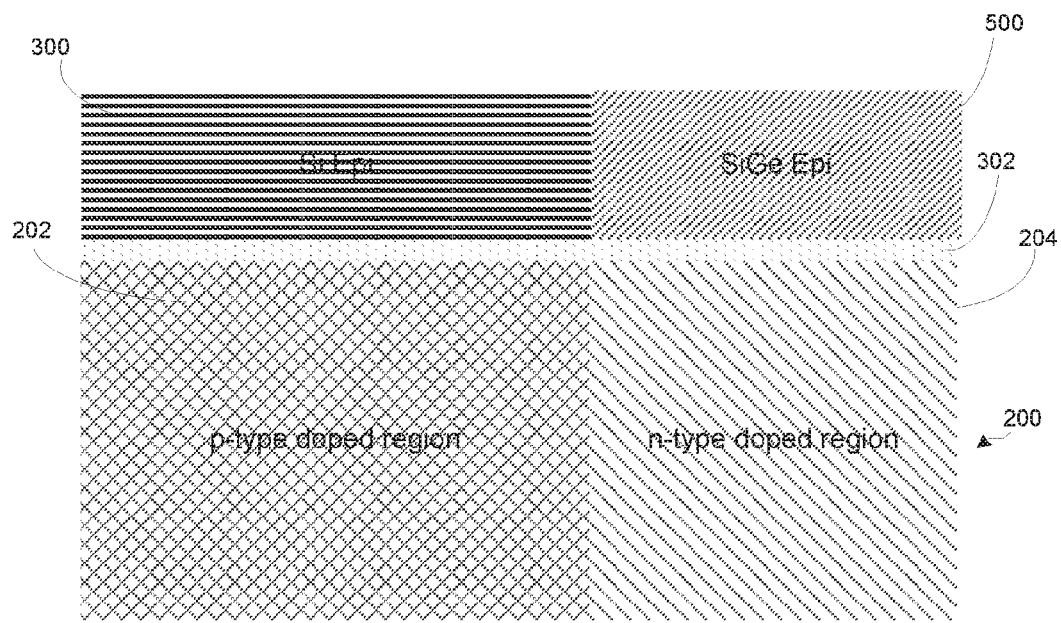

As shown in FIG. 5, the removed portion of the epitaxial Si layer 300 may be replaced with a layer of epitaxial SiGe 500 above the n-doped region 200. The epitaxial SiGe layer 500 is desirable for high-performance pMOS devices, which benefit from the compressive strain and the higher mobility of Ge as compared to Si. In one embodiment, the SiGe layer 500 may have a Ge concentration of about 20 to about 50%. The epitaxial SiGe layer 500 may be selectively grown above the n-type doped region to a height substantially similar to the height of the Si epi layer 300 by selecting the appropriate growth conditions. Moreover, growth conditions may also be selected to avoid growth of the SiGe epi layer 500 on the hard mask 400. After growth of the epitaxial SiGe layer 500 is complete, the hardmask 400 may be removed using conventional techniques, and thereafter a Chemical Mechanical Polish (CMP) process may be used to further planarize the surface of the epitaxial Si epi layer 300 and the epitaxial SiGe layer 500.

Figure 6:
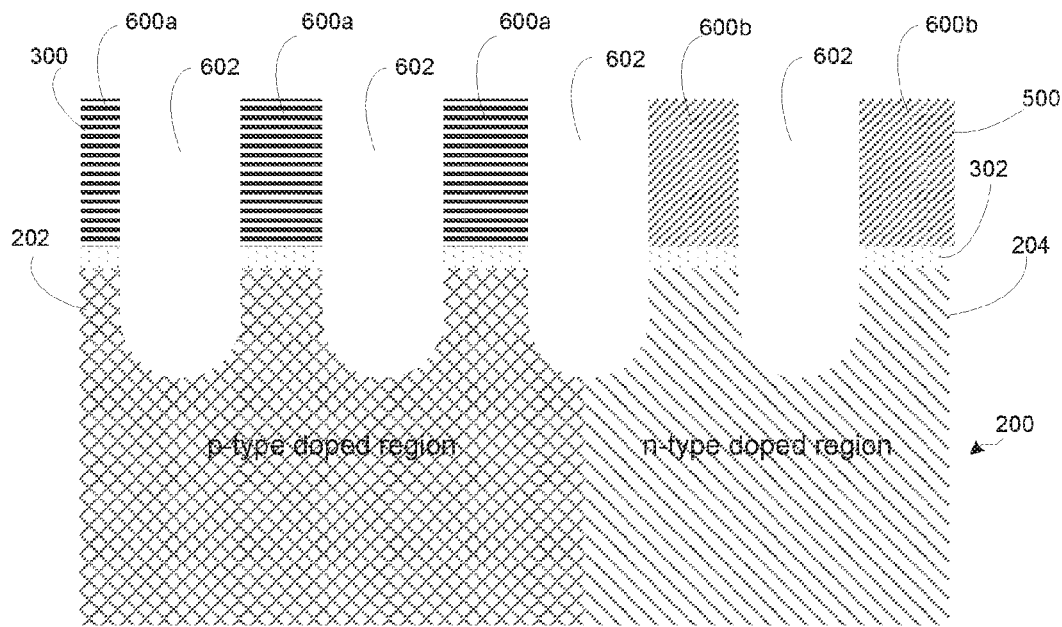
Figure 7:
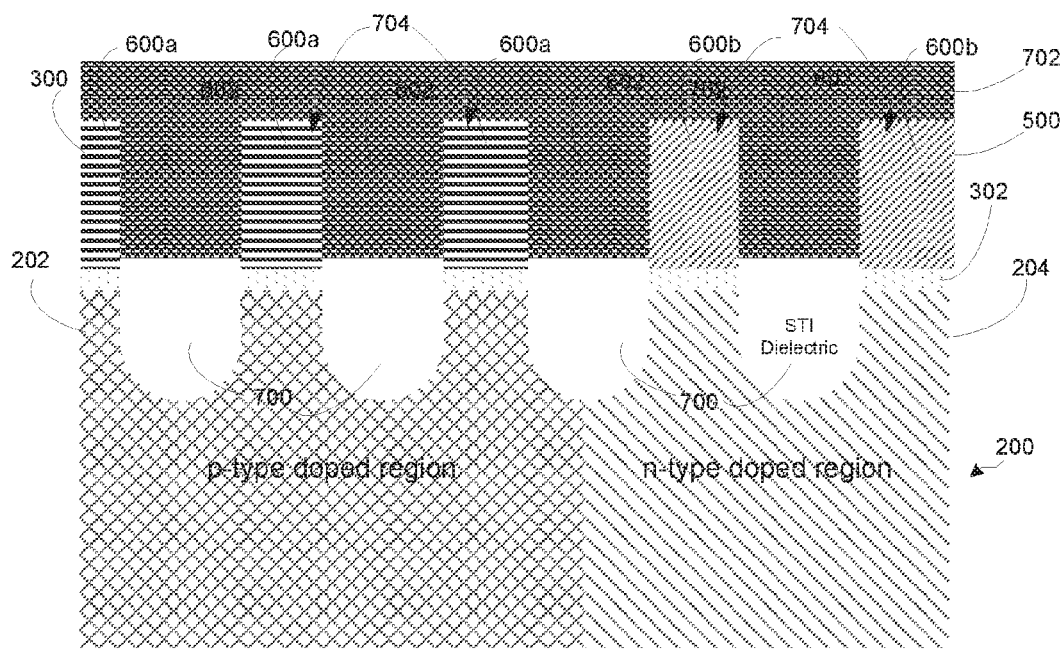

As shown in FIG. 6, conventional patterning and etching processes are used to form a series of substantially similar recesses 602 in the epitaxial Si epi layer 300 and the underlying p-type doped region 202 and in the epitaxial SiGe layer 500 and the underlying n-type doped region 204. The patterning techniques may, for example, include self-aligned double and quadruple patterning methods, or lithography techniques using extreme ultraviolet (UV) or e-beam processes. The fin etch process would preferably achieve comparable etch depths and fin width in both the epitaxial Si layer 300 and SiGe layer 500, as well as the p-type doped and n-type doped regions 202, 204 to produce both Si fins 600a and SiGe fins 600b.

In one embodiment, the fin etch process may be performed using a conventional dry etch process, such as a reactive-ion etching (RIE) process. In one embodiment, the dry etch processes are followed with one or more wet etch processes, such as ammonium hydroxide and hydrogen peroxide mixtures (APM) and hydrofluoric acid (HF) to remove material and/or remove unwanted residues.

After the fin etching is complete, it may be useful to implement a Shallow Trench Isolation (STI) process and, at least partially, fill all of the recesses 602 with an STI dielectric 700. Those skilled in the art will appreciate that during the STI process, temperature must be controlled so as to reduce undesirable dopant diffusion into the channel regions of the finFETs. For example, upper limits on temperature are time dependent. For example, a furnace process with an anneal time in excess of 10 minutes with slow ramp up and slow ramp down times may be limited to 800° C. or lower. For shorter anneal processes of about 1 min, a temperature of about 900° C. may be accommodated.

Additionally, in some embodiments it may be useful to include a SiN liner in the recesses 602 near the interface of the p-type doped region 202 and the Si layer 300 to reduce dopant loss (e.g., B and In) to the STI dielectric 700. Additionally, in some embodiments it may be useful to include a SiN liner in the recesses 602 near the interface of the n-type doped region 204 and the SiGe layer 500 to protect the SiGe from unwanted oxidation and/or material loss during, e.g., wet cleaning steps. In some embodiments, the same SiN liner is used in all of the recesses 602.

Hereafter, conventional fin reveal, gate formation, junction formation, contact formation, metallization, and the like may proceed using well known processes. For example, after the STI dielectric 700 layer is deposited, a chemical-mechanical polishing (CMP) process may be performed, along with additional steps to incorporate dopants in certain device areas to allow multiple threshold voltages by, for example, ion implantation, followed by an optional anneal process (e.g., rapid-thermal anneal). An oxide etching process may be performed to reveal the fins 600a, 600b by etching the STI dielectric 700 to the level shown in FIG. 7. Thereafter, a conventional gate formation process may be performed to produce the gate 702. These processes are readily known to those of ordinary skill in the art, and thus, are not discussed in greater detail herein to avoid unnecessarily obfuscating the invention. Additionally, while the figures indicate abrupt locations of dopants, in practice there will be some mixing as a result of effects like diffusion and implant straggle in the final structure.

Figure 8:
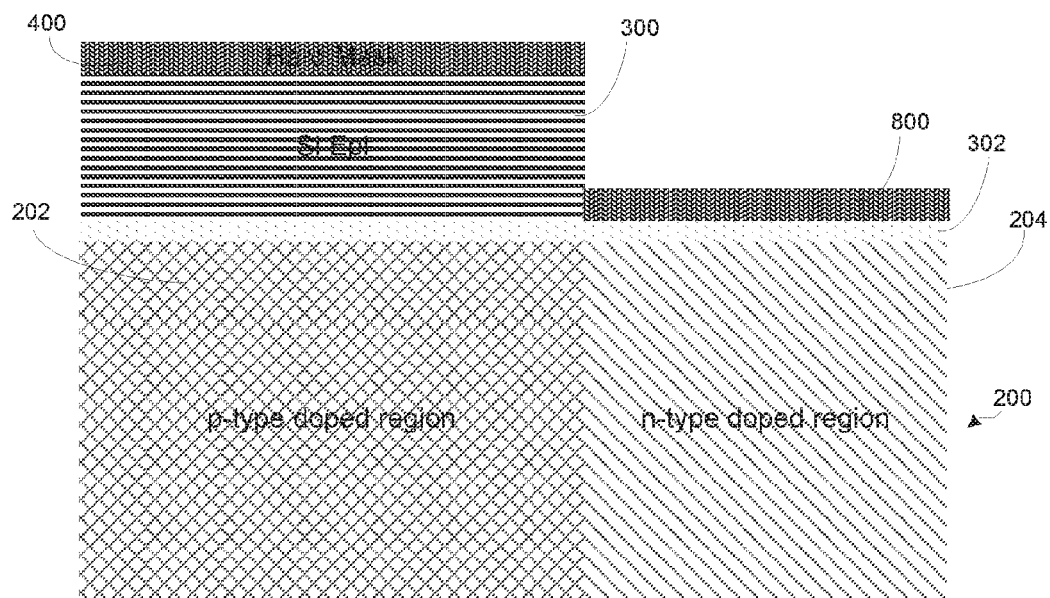
FIGS. 8-10 illustrate a stylized depiction of a series of process steps that are utilized to produce a second embodiment of a finFET device having regions that include a silicon epi layer and a silicon germanium layer.
Figure 9:
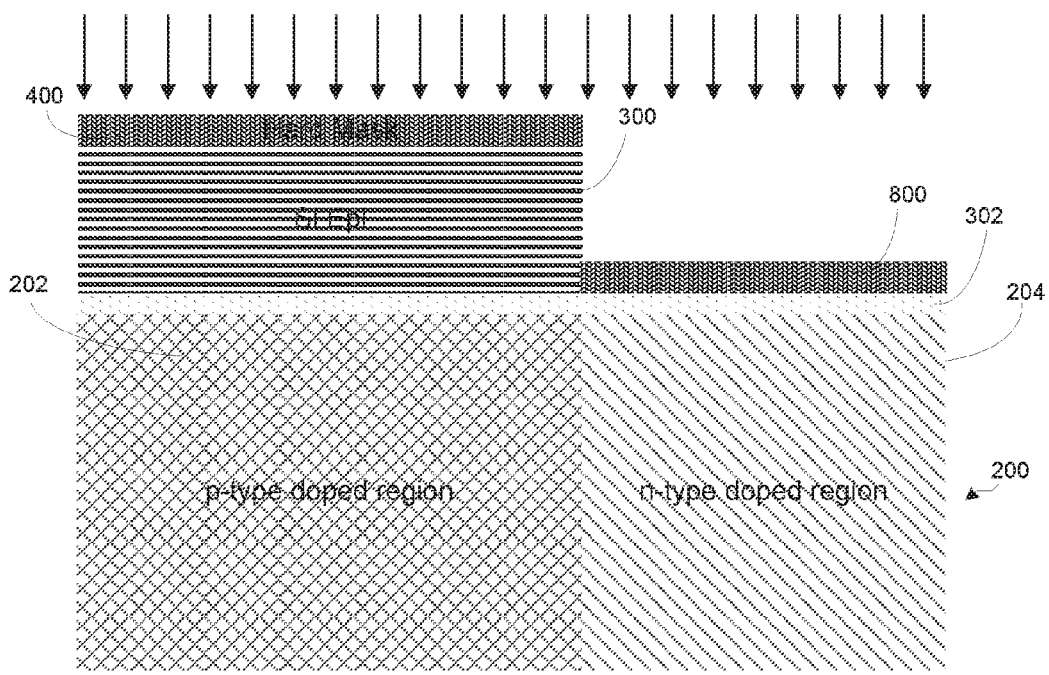
Figure 10:
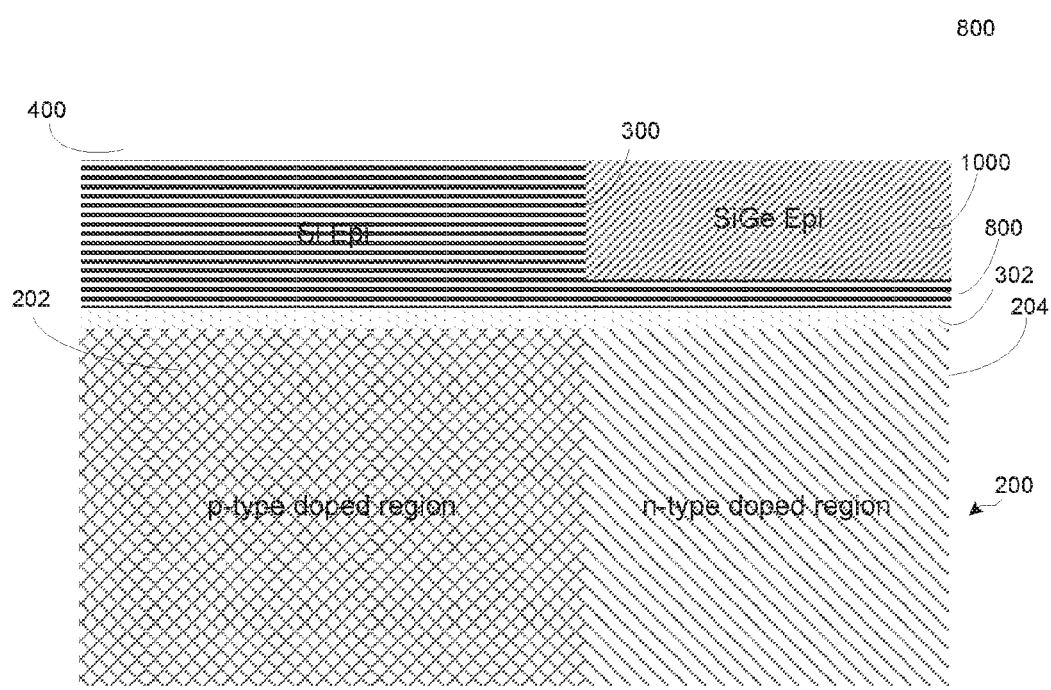

FIGS. 8-10 illustrate an alternative embodiment of a structure and a methodology for forming the structure that includes finFET transistors with fins that are formed from Si in a p-type doped region and fins that are formed from SiGe in an n-type doped region of a wafer. The process is substantially similar to that described in conjunction with FIGS. 2-7 but varies with that described in FIGS. 4 and 5. Thus, turning specifically to FIG. 8, at this point in the process, any of a variety of conventional patterning and etching schemes can be used to remove portions of the Si epi layer above the n-type doped region 204. For example, the hardmask 400, which may be comprised of Si, O, N, F, C, a combination thereof, or the like, may be placed above the Si epi layer 300 in a region above the p-type doped region 202. The hard mask 400 may have a thickness in the range of about 10 to about 100 nm. A subsequent conventional etch process may be applied to the exposed region of the Si epi layer 300. Unlike that illustrated in FIG. 4, it is envisioned that the etching process would halt short of the optional SiC layer 302 or the n-type doped region 204, but rather, the etch process would cease early, leaving a portion 800 of the Si epi layer 300 in place above the n-type doped region 204.

At this time, as shown in FIG. 9, it may be useful to create a Punch Through Stop (PTS) in the n-type doped region 204 that has a different depth than the PTS in the p-type doped region 202. For example, B typically diffuses more than As, and thus, As may be implanted at this point in the process.

As shown in FIG. 9, the removed portion of the Si epi layer 300 may be replaced with a layer of SiGe epi 900 above the remaining portion 800 of the Si epi layer 300. The SiGe epi layer 500 is desirable for high-performance pMOS devices, which benefit from the compressive strain and the Ge. The SiGe epi layer 1000 may be selectively grown above the remaining portion 800 of the Si epi layer 300 and the n-type doped region 204 to a height substantially similar to the height of the Si epi layer 300 by selecting the appropriate growth conditions. Moreover, growth conditions may also be selected to avoid growth of the SiGe epi layer 500 on the hard mask 400. After growth of the SiGe epi layer 900 is complete, the hardmask 400 may be removed using conventional techniques, and thereafter a Chemical Mechanical Polish (CMP) process may be used to further planarize the surface of the Si epi layer 300 and the SiGe epi layer 500.

Hereafter, the process associated with this second embodiment returns to substantially the same process described above in conjunction with FIGS. 6-8 of the first embodiment.

Figure 11:
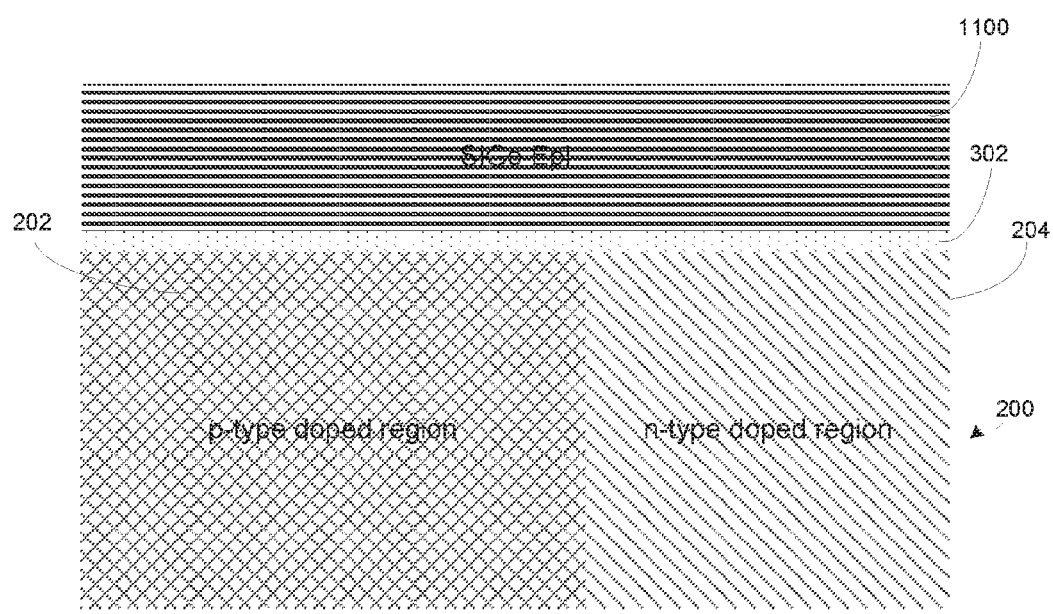
FIGS. 11-12 illustrate a stylized depiction of a series of process steps that are utilized to produce a third embodiment of a finFET device having regions that include a silicon epi layer and a silicon germanium layer.
Figure 12:
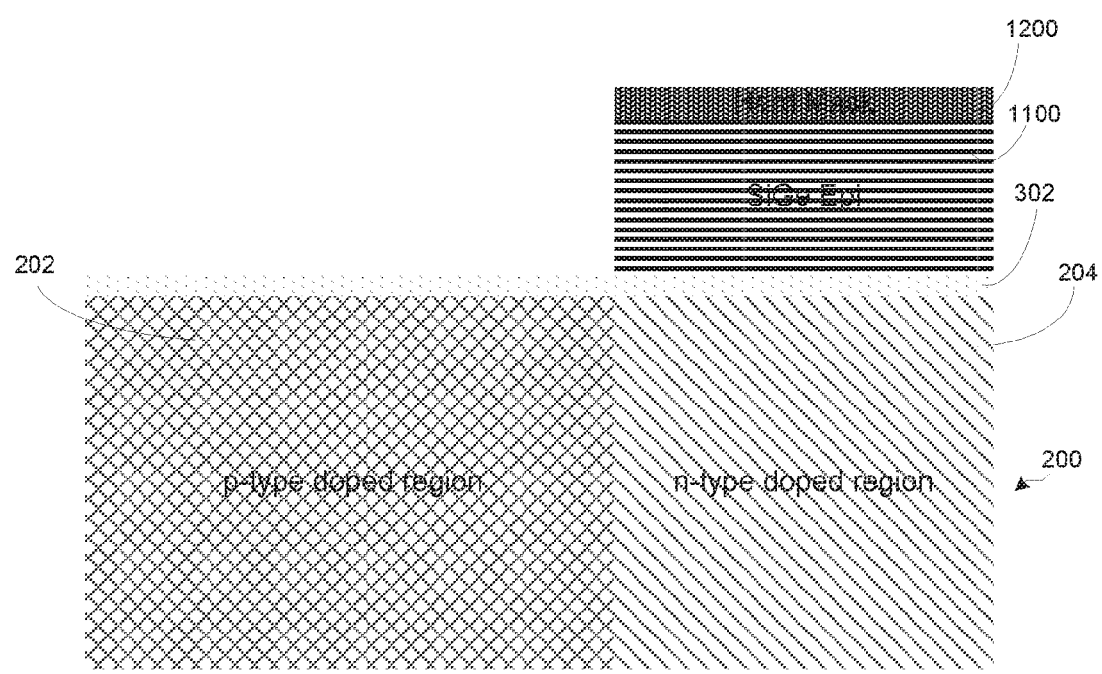

FIGS. 11-12 illustrate an alternative embodiment of a structure and a methodology for forming the structure that includes finFET transistors with fins that are formed from Si in an nMOS region and fins that are formed from SiGe in a pMOS region of a wafer. The process is substantially similar to that described in conjunction with FIGS. 2-7 but varies with that described in FIGS. 3 and 4 by reversing the order of the formation of the Si epi layer 300 and the SiGe layer 500. That is, in this alternative embodiment, the SiGe layer 500 is formed first, partially removed, and then the Si epi layer 300 is formed within a recess previously occupied by the now removed portion of the Si epi layer 300. Thus, turning specifically to FIG. 11, at this point in the process, a SiGe epitaxial layer 1100 has been grown over the wafer 200 using any of a variety of techniques. Those skilled in the art will appreciate that the thickness of the SiGe epi layer 1100 may vary substantially without departing from the spirit of scope of the instant invention. For example, it is envisioned that the thickness of the SiGe epi layer 1100 may vary in the range of about 20 to about 100 nm, with a preferred range of about 30 nm to about 80 nm so that fins of a desired height may be formed therewith, and may have a germanium concentration in a range of about 20 to about 50%. The SiGe epi layer 1100 may be nominally undoped or very lowly doped and may be grown using either selective or nonselective epi processes. However, nonselective epi processes are typically preferred because they can be performed at a lower cost and with increased uniformity.

In an alternative embodiment, a layer 302 of Si Carbon (SiC) may be deposited intermediate the wafer 200 and the SiGe epi layer 1100. The layer 302 may be optionally used to serve as a diffusion barrier. In particular, C is useful in suppressing diffusion of B and P. In one embodiment, the concentration of C may be established in the range of about 0.05 to about 1% with a thickness of about 2 nm to about 50 nm, depending upon the concentration of C. In a preferred embodiment, concentration of C is about 0.1 to about 0.4% and the layer 302 has a thickness of about 5 to about 20 nm.

At this point in the process, any of a variety of conventional patterning and etching schemes can be used to remove portions of the SiGe epi layer 1100 above the p-type doped region 204. For example, a hardmask 400, which may be comprised of Si, O, N, F, C, a combination thereof, or the like, may be placed above the Si epi layer 300 in a region above the p-type doped region 202. The hard mask 1200 may have a thickness in the range of about 10 to about 100 nm. A subsequent conventional etch process may be applied to the exposed region of the SiGe epi layer 1100. Various endpoints may be utilized to identify when the etch process has reached the desired level. For example, in those embodiments that have used the optional SiC epi layer 302, the detection of C may be used as an endpoint indication. Alternatively, the material used for the p-type dopant may also be detected as an endpoint indication. For example, p-type dopant materials such as B, Ga, or In, etc. may be detected as an endpoint indication.

Hereafter, the process continues as illustrated in FIG. 5 with the removed portion of the SiGe epi layer 1100 having been replaced with a layer of Si epi 300 above the p-type doped region 202. The SiGe epi layer 1100 is desirable for high-performance pMOS devices, which have improved mobility as a benefit from the compressive strain and the Ge. The Si epi layer 300 may be selectively grown above the p-type doped region to a height substantially similar to the height of the SiGe epi layer 1100 by selecting the appropriate growth conditions. Moreover, growth conditions may also be selected to avoid growth of the Si epi layer 300 on the hard mask 1200. After growth of the Si epi layer 300 is complete, the hardmask 1200 may be removed using conventional techniques, and thereafter a Chemical Mechanical Polish (CMP) process may be used to further planarize the surface of the Si epi layer 300 and the SiGe epi layer 1100.

Figure 13:
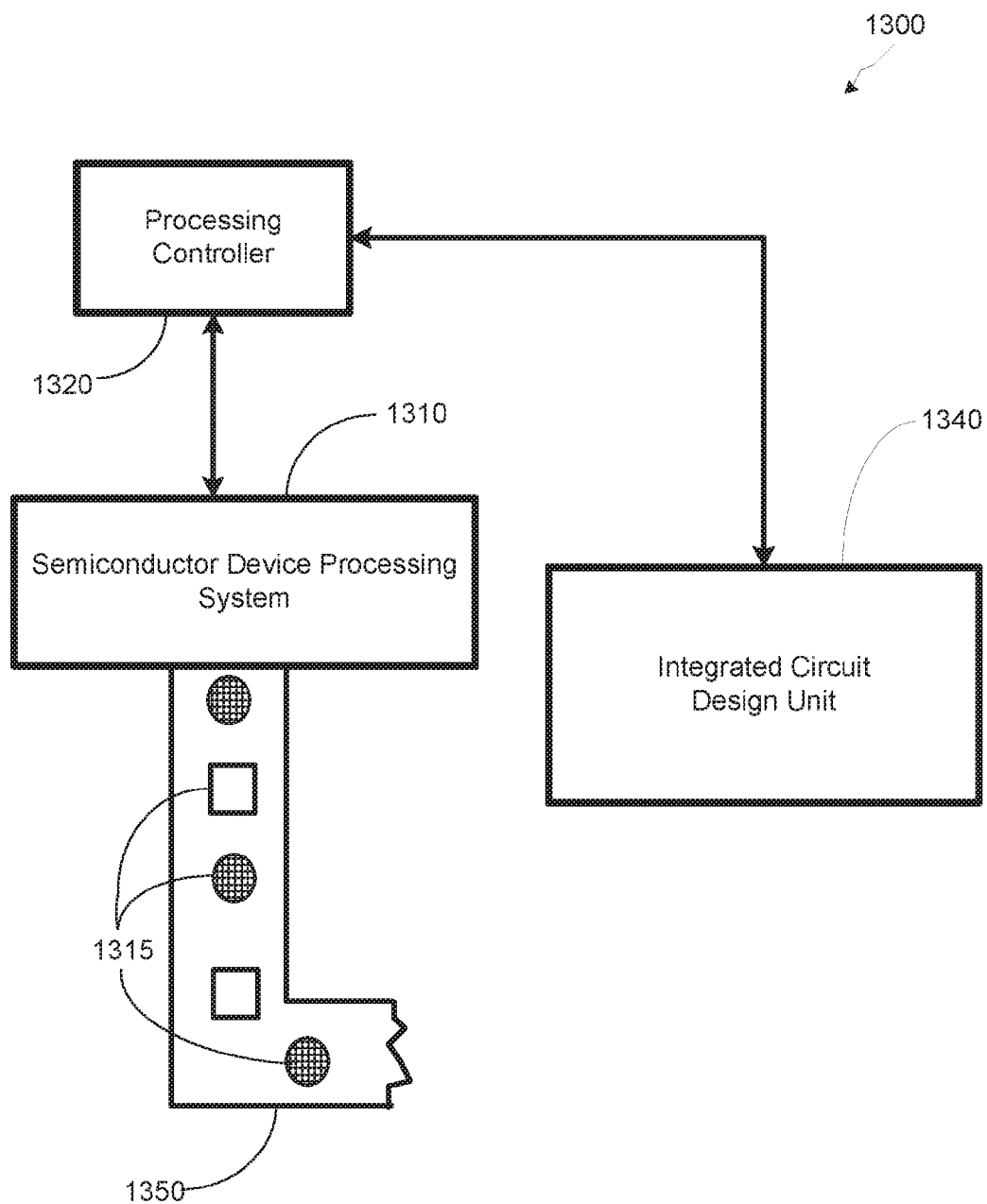
FIG. 13 illustrates a stylized depiction of a system for fabricating a semiconductor device comprising a finFET device having both Si and SiGe fins.

Turning now to FIG. 13, a stylized depiction of a system for fabricating a semiconductor device comprising a finFET device having both Si and SiGe fins, in accordance with embodiments herein, is illustrated. The system 1300 of FIG. 13 may comprise a semiconductor device processing system 1310 and a design unit 1340. The semiconductor device processing system 1310 may manufacture integrated circuit devices based upon one or more designs provided by the design unit 1340.

The semiconductor device processing system 1310 may comprise various processing stations, such as etch process stations, photolithography process stations, CMP process stations, etc. One or more of the processing steps performed by the processing system 1310 may be controlled by the processing controller 1320. The processing controller 1320 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1310 may produce integrated circuits on a medium, such as silicon wafers. The production of integrated circuits by the device processing system 1310 may be based upon the circuit designs provided by the integrated circuits design unit 1340. The processing system 1310 may provide processed integrated circuits/devices 1315 on a transport mechanism 1350, such as a conveyor system. In some embodiments, the conveyor system may be sophisticated clean room transport systems that are capable of transporting semiconductor wafers. In one embodiment, the semiconductor device processing system 1310 may comprise a plurality of processing steps, e.g., the $1^{st}$ process step, the $2^{nd}$ process set, etc., as described above.

In some embodiments, the items labeled "1315" may represent individual wafers, and in other embodiments, the items 1315 may represent a group of semiconductor wafers, e.g., a "lot" of semiconductor wafers. The integrated circuit or device 1315 may be a transistor, a capacitor, a resistor, a memory cell, a processor, and/or the like. In one embodiment, the device 1315 is a transistor and the dielectric layer is a gate insulation layer for the transistor.

The integrated circuit design unit 1340 of the system 1300 is capable of providing a circuit design that may be manufactured by the semiconductor processing system 1310. The design unit 1340 may receive data relating to the functional cells to utilize, as well as the design specifications for the integrated circuits to be designed. In one embodiment, the integrated circuit design unit 1340 may comprise finFETs having both Si and SiGe fins.

The system 1300 may be capable of performing analysis and manufacturing of various products involving various technologies. For example, the system 1300 may use design and production data for manufacturing devices of CMOS technology, Flash technology, BiCMOS technology, power devices, memory devices (e.g., DRAM devices), NAND memory devices, and/or various other semiconductor technologies.

The methods described above may be governed by instructions that are stored in a non-transitory computer readable storage medium and that are executed by, e.g., a processor in a computing device. Each of the operations described herein may correspond to instructions stored in a non-transitory computer memory or computer readable storage medium. In various embodiments, the non-transitory computer readable storage medium includes a magnetic or optical disk storage device, solid state storage devices such as flash memory, or other non-volatile memory device or devices. The computer readable instructions stored on the non-transitory computer readable storage medium may be in source code, assembly language code, object code, or other instruction format that is interpreted and/or executable by one or more processors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed is:

1. A method for forming a finFET device, comprising:
   forming an n-doped region and a p-doped region in a semiconductor wafer;
   forming a layer of silicon above both the n-doped and p-doped regions;
   removing a portion of the silicon layer above the n-doped region to form a first recess;
   implanting n-type dopants into the first recess after forming the first recess;
   forming a layer of silicon germanium in the first recess after implanting the n-type dopants into the first recess;
   etching away at least a portion of the silicon layer and the underlying p-doped region;
   etching away at least a portion of the silicon germanium layer and the underlying n-doped region;
   forming fins of the finFET device from the unetched silicon and silicon germanium layers; and
   forming a shallow trench isolation dielectric in the etched away portion of the silicon layer and the underlying p-doped region and in the etched away portion of the silicon germanium layer and the underlying n-doped region.

2. The method of claim 1, further comprising forming a silicon carbon layer intermediate the layer of silicon and the n-doped and p-doped regions.

3. The method of claim 2, wherein forming the layer of silicon carbon intermediate the layer of silicon and the n-doped and p-doped regions further comprises forming a layer of silicon carbon having a carbon concentration in a range of 0.05% to 1% and a thickness in a range of 2 nm to 50 nm.

4. The method of claim 2, wherein forming the layer of silicon carbon intermediate the layer of silicon and the n-doped and p-doped regions further comprises forming a layer of silicon carbon having a carbon concentration in the range of 0.1% to 0.4% and a thickness in a range of 5 nm to 20 nm.

5. The method of claim 2, wherein removing the portion of the silicon layer above the n-doped region to create the first recess further comprises etching the silicon layer until the etching process reaches the silicon carbon layer.

6. The method of claim 1, wherein removing the portion of the silicon layer above the n-doped region to create the first recess further comprises etching the silicon layer until the etching process reaches the n-doped region.

7. The method of claim 1, wherein forming the p-doped region in the semiconductor wafer further comprises forming the p-doped region in the semiconductor wafer by patterned ion implantation of at least one p-type dopant from the group of boron (B), gallium (Ga), and indium (In) using a peak dopant concentration in a range of 1e18 atoms/cm$^3$ to 2e19 atoms/cm$^3$.

8. The method of claim 1, wherein forming the n-doped region in the semiconductor wafer further comprises forming the n-doped region in the semiconductor wafer by patterned ion implantation of at least one n-type dopant from the group of phosphorus (P), arsenic (As), and antimony (Sb) using a peak dopant concentration in a range 1e18 atoms/cm$^3$ to 2e19 atoms/cm$^3$.

9. The method of claim 1, wherein forming a layer of silicon above the n-doped and p-doped regions further comprises forming an epitaxial silicon layer having a thickness in a range of 30 nm to 80 nm.

10. The method of claim 1, wherein forming a silicon germanium layer further comprises forming an epitaxial silicon germanium layer grown selectively on exposed crystalline silicon regions and having a germanium concentration in a range of 20% to 50% and having a thickness in a range of 30 nm to 80 nm.

11. The method of claim 1, wherein etching away at least a portion of the silicon layer and the underlying p-doped region, and etching away at least a portion of the silicon germanium layer and the underlying n-doped region further comprises using a single etching process to etch away at least a portion of the silicon layer and the underlying p-doped region and etching away at least a portion of the silicon germanium layer and the underlying n-doped region.

* * * * *